United States Patent [19]
Moorshead

[11] 3,949,295
[45] Apr. 6, 1976

[54] APPARATUS FOR RETAINING ARTICLES IN AN ARRAY FOR TESTING

[75] Inventor: George G. Moorshead, Warrensburg, Mo.

[73] Assignee: Western Electric Company, Inc., New York, N.Y.

[22] Filed: Mar. 20, 1974

[21] Appl. No.: 453,124

[52] U.S. Cl. .............................. 324/158 F; 269/21
[51] Int. Cl.² .................. G01R 31/02; B25B 11/00
[58] Field of Search... 324/158 F, 28, 158 P, 158 R; 339/117 P; 209/81, 74, 73; 294/65; 269/21

[56] References Cited
UNITED STATES PATENTS

| | | | |
|---|---|---|---|
| 2,580,628 | 1/1952 | Welsh | 339/117 P |
| 2,782,574 | 2/1957 | Copold | 269/21 |
| 3,038,117 | 6/1962 | Blain | 324/158 F |
| 3,437,929 | 4/1969 | Glenn | 324/158 F |
| 3,543,214 | 11/1970 | Johnston | 339/117 P |
| 3,865,359 | 2/1975 | Caroli | 294/65 |

*Primary Examiner*—R. V. Rolinec
*Assistant Examiner*—Ernest F. Karlsen
*Attorney, Agent, or Firm*—W. O. Schellin

[57] ABSTRACT

Discrete semiconductor chips, such as sheet-diffused diodes are mass-tested after separation from a wafer. A carrier for retaining the chips in a predetermined array for testing has a plurality of cavities located in a planar surface and arranged in accordance with the predetermined array. The devices are loaded into the cavities and retained therein by a vacuum connected to each of the cavities. Electrical contact is made through the bases of the cavities to the bottom surfaces of the chips, while insulating walls of the cavities prevent leakage paths around the chips. The carrier is indexed in steps corresponding to the increments of the array to permit the top surface of each of the loaded chips to be contacted in sequence by a probe to establish electrical connection through such chip to a test set to test the chip.

3 Claims, 5 Drawing Figures

APPARATUS FOR RETAINING ARTICLES IN AN ARRAY FOR TESTING

BACKGROUND OF THE INVENTION

1. Field of the Invention

This invention relates to an apparatus for arranging a plurality of articles in an array for testing. More particularly, the invention relates to an apparatus for arranging small discrete articles, such as sheet diffused diode chips, in an array to permit automated testing of the chips.

2. Discussion of the Prior Art

Small electronic devices such as diodes and transistors are usually electrically tested prior to final packaging by commercially available test apparatus. Such test apparatus usually includes an X-Y or an X-Y-Z indexing table and a probe head mounted above the table. The devices to be tested are located on the table. Testing the devices economically requires that they be located in an array on the table to permit the table to be automatically indexed in accordance with preselected steps to position the devices in sequence with respect to the probe head.

Most devices are manufactured in such an array on a wafer. These devices are tested and marked in a process referred to as wafer probing. After separation from the wafer the devices are then grouped into acceptable and defective ones.

Sheet-diffused diodes cannot be tested before they are separated from the wafer. Before being separated into individual devices, the sheet-diffused wafer constitutes a single large-surfaced diode with a single diode junction extending parallel to its two planar metallized surfaces. When this wafer is separated into individual devices or chips, each of these chips becomes a diode. However, parameters of each of these diodes, such as the reverse bias leakage current, may vary and in some cases they may fall outside of a desired range of values. Consequently, it is desirable to test each of these diode chips after they have been separated from the wafer. Testing the individual chips, however, has not been feasible up to now, partly because handling small devices is by itself, difficult and partly because of the special atmosphere wherein the chips are maintained after separation.

Conventional methods require subjecting the chips after separation to an etching and a drying operation. After the etching operation, drying takes place in a dry, inert atmosphere. Testing the chips is advantageously done immediately after drying, otherwise the normal moisture content in ambient air affects the test results. However, handling small chips in a dry atmosphere presents special problems. For instance, electrostatic forces on the chips increase the difficulty and the cost of handling and arranging the chips into an array.

In the past, instead of testing all chips collectively, a statistical approach has been used to determine whether all chips of a process lot can be assembled into the final product or whether they shall be rejected entirely. Because of the additional cost of final assembly a decision point for accepting or rejecting a given process lot is reached when approximately 20% of chips tested on a random basis are found to be defective. The actual decision point, of course, depends on the cost of the final packaging. Rejecting some process lots entirely results in substantial material losses, and a correspondingly increased manufacturing cost. If, however, all acceptable chips can effectively and economically be separated from defective ones, substantial material savings can be achieved.

SUMMARY OF THE INVENTION

It is, therefore, an object of this invention to provide apparatus for efficiently arranging chips in an array while maintaining them in a dry atmosphere.

Another object of the invention is to position the chips in an array and to index the array to align the chips in sequence with respect to a test probe.

A further object of the invention is to provide peripheral insulation to chips which are being tested to prevent a current leakage path affecting test results.

In accordance with the invention, an apparatus for retaining a plurality of articles for testing is provided. The apparatus has a planar surface. A plurality of open cavities are located in the surface according to a predetermined array. Each cavity has at least one conductive contact surface in its base and an aperture adjacent thereto, the aperture being connected to a provision for producing a vacuum. Walls of each of the cavities are electrically insulating.

BRIEF DESCRIPTION OF THE DRAWING

Other objects and features of the invention will be best understood from the following detailed description of a specific embodiment of the invention when read in conjunction with the attached drawing, wherein.

DETAILED DESCRIPTION

The present invention is described with respect to a known process wherein a sheet diffused wafer (not shown) is separated into individual chips 11 by a "gritblast" operation. For this operation, a masking array of steel dots is placed over the wafer. The masked wafer is then subjected to an abrasive stream of fluid. The fluid cuts portions of the wafers not shielded by the dots to separate the wafer into the individual chips 11.

Figure 1:
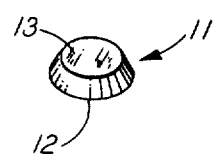
FIG. 1 is a pictorial representation of a diode chip, a plurality of which are to be tested in accordance with the present invention.

Referring now to FIG. 1 there is shown a diode chip 11 which has been cut by the grid blast operation from such a sheet-diffused wafer. A base 12 and a top surface 13 are metallized surface portions of the original wafer. These surface portions 12 and 13 are the anode and the cathode electrodes of the diode. The diode junction extends as a plane parallel to the base 12 and to the top surface 13 across a semiconductive body portion 14 of the chip 11.

Conventionally, separation of the chip 11 from the wafer is followed by etching and drying operations which culminate in a final bakeout step. During this bakeout step, the chips, such as the chip 11, are maintained in a dry air oven 15 for about 2 hours at a temperature of approximately 250°C. The bakeout step removes moisture from the chips 11. Any moisture accumulating on the surface of the chips 11 affects their reverse leakage parameters. Therefore, the chips 11 are advantageously tested at the completion of the bakeout step under exclusion of moisture from the atmosphere.

Figure 3:
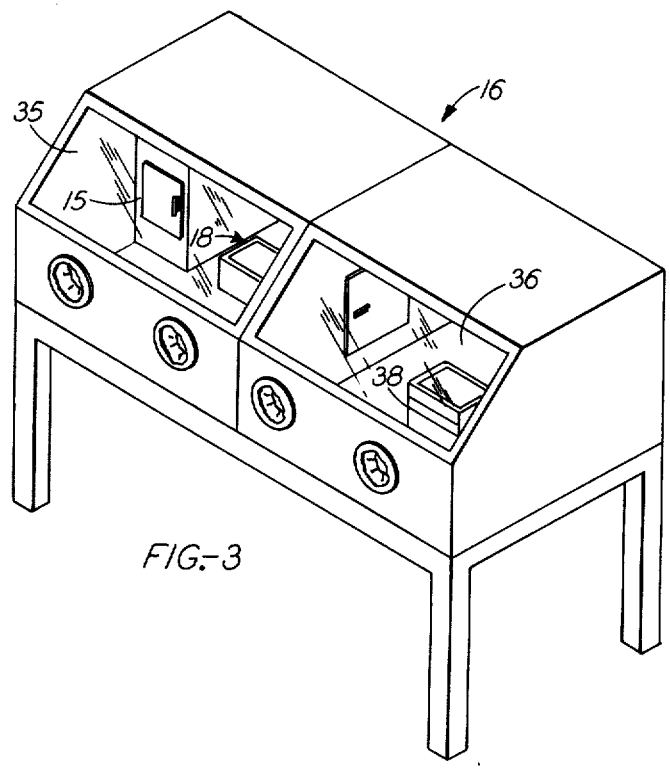
FIG. 3 is a pictorial representation of an enclosure containing a dry and inert atmosphere.
Figure 2:
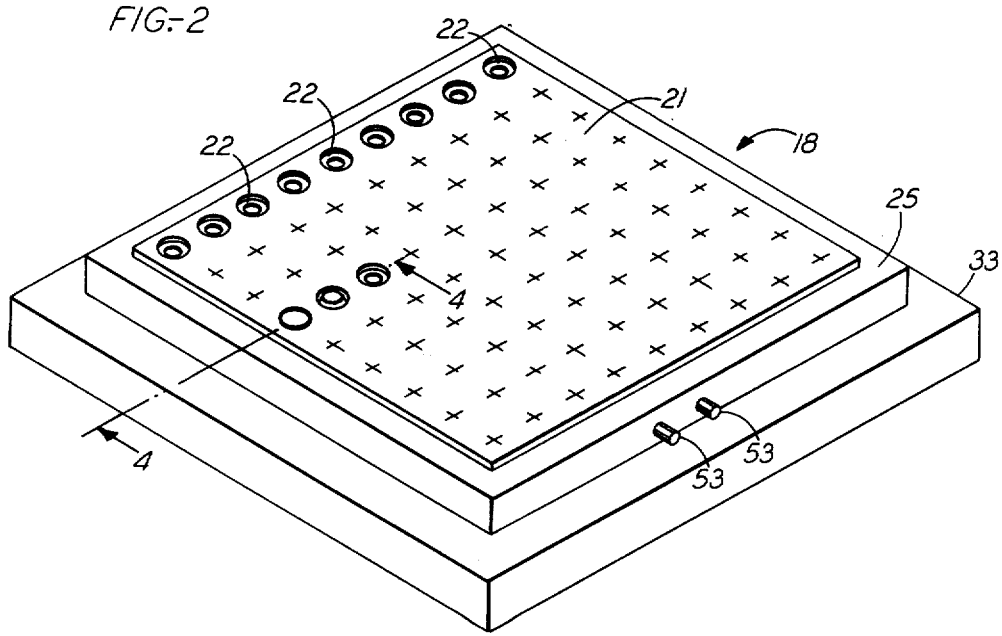
FIG. 2 is a pictorial view of a device which permits arranging and testing a plurality of chips of FIG. 1.

The dry air oven is maintained within an enclosure 16, shown in FIG. 3. At the end of the bakeout step, the chips 11 are removed from the oven 15, and, still being maintained within the enclosure 16, the chips 11 are placed onto an apparatus or a device which is generally designated by the numeral 18. Referring to FIG. 2, the device 18 has a planar surface 21 wherein a plurality of cylindrical cavities 22 are arranged in a predetermined array. Each of the cavities 22 has a depth which is substantially the same as the thickness of the chips 11. The diameter of the cavities 22 is chosen to be in the range of 5–15 percent larger than the largest diameter of the chips 11.

The chips 11, after having been placed on the surface 21 of the device 18, are now loaded into the cavities 22. Loading the chips 11 into the cavities 22 is preferably accomplished by jarring or vibrating the device 18. Because the chips are located within the dry atmosphere, forces due to electrostatic charges affect the manipulation of the chips. Consequently, loading the chips by vibrating the devices 18 can advantageously be supplemented with or replaced by brushing the chips 11 over the surface 21 with a conventional, commercially available anti-static brush until all chips have been inserted in the cavities 22, or until substantially all of the cavities of the device 18 have been filled. Once manipulated into the cavities 22, the chips 11 are retained therein by a partial vacuum produced at their lower surfaces.

Figure 4:
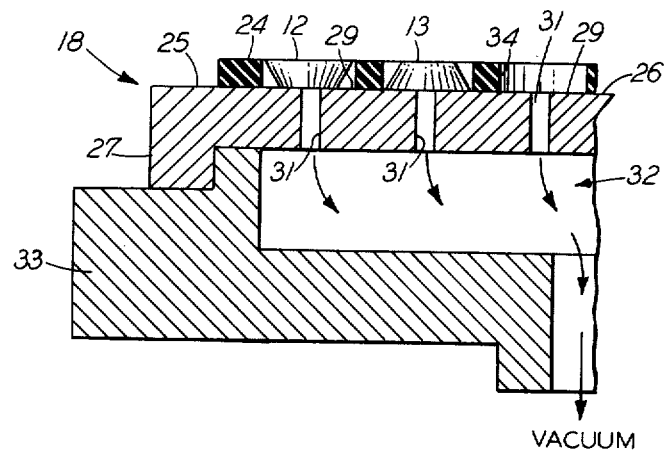
FIG. 4 is a section through a portion of the device shown in FIG. 2.

The cross section, in FIG. 4, of the device 18 shows a top layer 24 which covers, except for a peripheral area 25, the top surface 26 of a base member 27 of the device 18. The cavities 22 extend in depth through the layer 24 and each of the cavities 22 has as its base or bottom surface 29 a portion of the top surface 26 of the base member 27. Apertures 31 extend from each of the bottom surfaces 29 into the base member 27 to connect the respective cavities 22 with a central chamber 32, while the chips 11 are being loaded into the cavities 22 the device 18 is preferably placed on a vacuum chuck 33 to hold the device 18 in relation to the chuck 33, and to produce a vacuum pull on each of the chips 11 already loaded into the cavities 22.

As a result of the prior grid blast cutting operation, the chips 11 are frustoconical. When they are inserted into the cavities 22, the larger bottom surfaces 12 of the chips 11 lie, at random, either against the bottom surfaces 29 of the cavities 22, or toward the top of the cavities, substantially flush with the planar surface 21 which is synonymous with the top surface of the layer 24. When the bottom surfaces 12 are flush with the planar surface 21, edges of the surface 12 or portions of the semiconductive body 14 immediately adjacent thereto are likely to make contact with inner walls 34 of the cavities 22.

A contact of the edges of the surfaces 12 with any conductive element tends to establish an electrical connection therewith. Since such a connection is not made in each and every case, occasionally a leakage can be established from one of the chips to such a conductive element. An insulating material covering the cavity walls 34 prevents any electrical leakage paths being formed through the walls 34 to bypass the chips 11. Such leakage paths tend to falsely indicate defective chips 11. However, even though the walls 34 of the cavities 22 are desirably insulators, the bottom surfaces 29 of the cavities have to make electrical contact to the lower surfaces of chips 11. In the preferred embodiment the layer 24 is an insulator and the base member 27 is a conductor. Consequently, electrical connections can be made to both surfaces 12 and 13 of the chips 11, while leakage paths around the chips are avoided.

Figure 5:
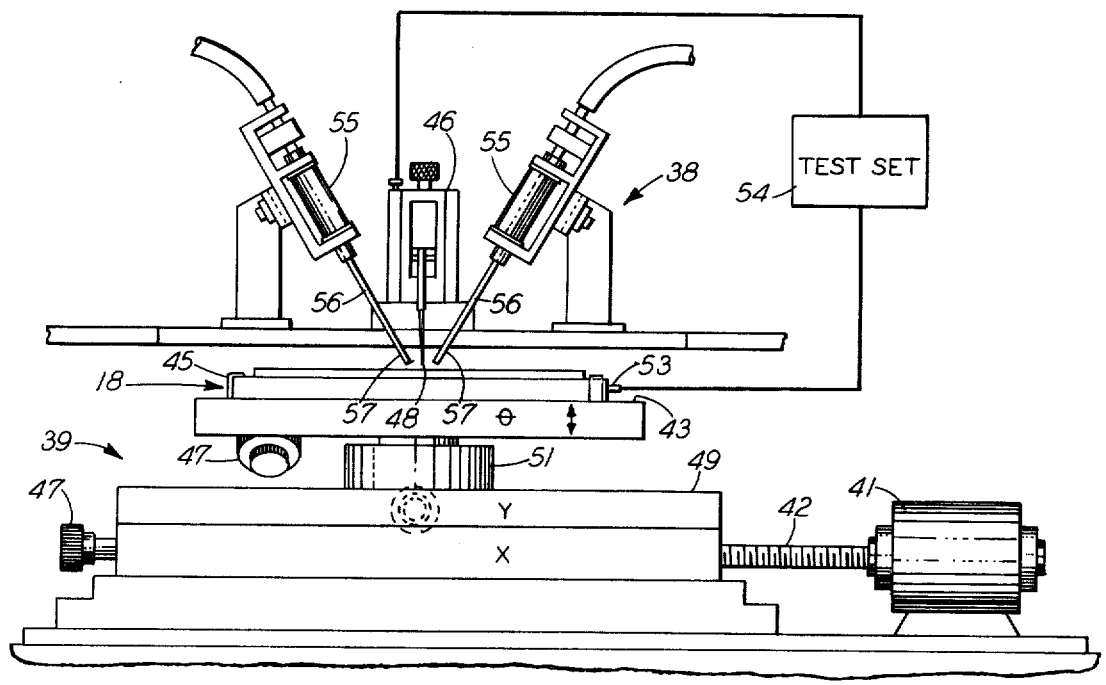
FIG. 5 shows the device of FIG. 2 mounted on an indexable pedestal in relation to a probe of a test apparatus.

After loading the chips 11 into the device 18, the device is transferred from a first chamber 35 of the enclosure 16 to a second chamber 36. Both chambers 35 and 36 contain the dry and inert atmosphere. In the second chamber 36 chips 11 are tested or probed by apparatus similar to commercially available apparatus for probing wafers. FIG. 5 is a somewhat simplified side view of such an apparatus, which is designated generally be the numeral 38. The apparatus 38 includes a positioning or indexing table 39. The table 39 is adapted to move in the X and the Y directions, driven by a conventional drive, such as, for instance, a combination of a motor 41 and a lead screw 42 to drive each of the respective stages.

A top stage 43 of the table 39 is equipped to accept the device 18 and to produce a vacuum in the chamber 32 in a manner similar to that shown in FIG. 4. The vacuum in the chamber 32 serves two functions: (1) it produces vacuum suction in each of the apertures to retain the loaded chips 11 in their respective cavities 22, and (2) it aids a clamping provision 45 to secure the device 18 fixedly against the top stage 43 of the table 39. The clamping provision 45 is used in addition to the vacuum hold on the device 18 to prevent the device from shifting its position during indexing movements by the table 39.

The apparatus 38 further includes a probe 46 positioned above the planar surface 21 after the device 18 is placed on the top stage 43. As it is common in wafer probers, the apparatus 38 includes means 47 for manually adjusting the table 39 with respect to the probe 46 to align a probe tip 48 substantially with the center of the cavities 22 in the device 18.

The extent of the travel of the table 39 is somewhat greater than the size of the array of cavities. Within the permissible travel, the table 39 is movable in a conventional manner used in wafer probing to index the top stage 43 of the table in the X direction and to successively align each of the cavities 22 of one of the rows of the array with the probe tip 48. When all of the cavities 22 of a given row have been indexed through an alignment position with the probe tip 48, the motor 41 of the Y stage 49 is activated to advance the device 18 to the next row of cavities 22. Simultaneously therewith, the direction of the stepping function in the X direction is reversed so that successively all of the cavities 22 of the row adjacent to the prior one become aligned with the probe tip 48.

The chips 11 are probed after each indexing operation by displacing the probe 46 with respect to the device 11 to contact one of the chips 11 with the probe tip 48. Contacting the chips 11 is accomplished by reciprocating the top stage 43 by a linear activator 51 toward and away from the probe 46. When the top stage 43 is in a raised position, the probe tip 48 contacts the upper surface of the aligned chip 11.

Through the probe 46, the upper surface of the respective chip 11, and through the base member 27 and a connector 53, the lower surface of the chip 11 becomes switched into a circuit of a test set 54. The test set 54 has the capability of reversing the direction in which test voltages are applied to the surfaces 12 and 13 of the chips 11. Consequently, the chips 11 can be tested irrespective of whether the large surfaces 12 are facing toward the top of the cavities 22 where they are contacted by the probe tip 48, or whether the surfaces 12 face and are contacted by the bottom surfaces 29 of the cavities 22.

The bottom surfaces 29 of the cavities 22 are of a material offering low surface or contact resistance to the contacting electrodes of the chips 11 to establish low resistance contacts between the chips and the base member 27 of the device 18. Preferably, an area about each of the apertures 31 is gold plated to eliminate problems caused by oxidation of the surfaces 29 over a long period of time. The layer 24, being an insulator, renders the walls 34 nonconductive. Consequently, a leakage path from the surface 12 of the chips 11, FIG. 4, to the top of the layer 24 and then through the layer 24 to the base member 27 is avoided.

It is considered to be within the scope of this invention to form the cavities 22 in a homogeneously conductive base member, such as the member 27, and then coat the walls 34 of the cavities 22 with an insulator material. In the alternative, the cavities 22 can be formed in a homogeneously insulative material wherein contacts are terminated at the base surfaces of the cavities. It is preferred, however, to form the insulating layer 24 on top of the conductive member 27. The layer 24 is of a cast epoxy material. The cavities 22 are generated in the cured epoxy layer counterboring through the thickness of the layer 24 to the top surfaces 26 of the member 27 to form the walls 34 of the cavities 22 and their bottom surfaces 29 about the apertures 31. The apertures 31 are preferably formed by drilling through the member 27 after the cavities 22 have been generated.

The test set 54 initiates the movements of the X–Y indexing mechanism. When one of the chips 11 has been tested, signals by the test set 54 cause the top stage 43 to be lowered away from the probe 46. Thereafter, the table 39 indexes to the next cavity to present the next chip 11 to the test probe 46.

If the chip 11 which has just been tested is found to be defective, the test set 54 further activates a solenoid 55 of the trailing one of two vacuum suction nozzles 56 mounted to either side of the probe 46. The solenoid 55 lowers the nozzle 56 toward the surface 21. Openings 57 of the nozzles are positioned one index space away from the probe tip 48. Consequently, the opening 57 of the trailing one of the nozzles 56 is positioned directly over the chip 11 that has just been tested. A vacuum connected to such trailing nozzle 56 is turned on, overcomes the vacuum holding the chips 11 in the cavities 22, lifts the defective chip 11 from its cavity 22, and deposits it in a trap (not shown) located in the vacuum line connected to each nozzle 56. Depending on the direction in which the table 39 is stepping, either one of the other of the two nozzles 56 will be the trailing one to be activated to remove the defective chip 11.

The above is an illustrative example of the invention, and it is to be understood that the invention is not limited thereto, is capable of modification and can be rearranged without departing from the spirit and scope of the invention.

What is claimed is:

1. An apparatus for electrically testing a plurality of articles under controlled humidity conditions, which comprises:

an enclosure for controlling humidity conditions of an atmosphere within the confines of the enclosure;

a device for retaining a plurality of the articles in an array, the device being positioned within the enclosure and including a conductive base having a plurality of apertures in a surface thereof, the apertures being positioned to correspond to the array, and an insulating sheet covering the apertured surface of the base, the sheet having a plurality of apertures located coaxially with respect to the apertures in the base, each of the apertures in the sheet being of a size so as to accept one of the articles to permit a surface of the article to cover the respective aperture in the base;

means for producing a vacuum, connected through the base to each of the apertures, whereby the articles loaded into the apertures of the insulating sheet are brought into contact with the conductive base; and means for contacting the top surfaces of the articles in contact with the base with an electronic test probe to complete a test circuit through the articles whereby the articles are tested while being located in the array within the enclosure under controlled humidity conditions.

2. Apparatus for handling and testing electronic articles, which comprises:

an enclosure for controlling predetermined atmospheric conditions therein;

means, positioned within the enclosure, for locating the articles in an array, the locating means including a base having a base member with a planar, conductive top surface, and a nonconductive top layer of uniform thickness located on the top surface of the base member, an array of open cavities located in the top layer and extending therethrough, each of the cavities having a conductive base formed by a corresponding portion of the top surface of the base member and nonconductive sides formed by the top layer, and an aperture in the base portion of each of the cavities, such apertures connected to a vacuum source;

a test apparatus having probe means located within the enclosure; and means for positioning the locating means with respect to the probe means for probing any such articles located in the array.

3. An apparatus according to claim 2, wherein: the depth of the cavities is substantially equal to the height of the articles to be retained therein; the cavities are cylindrical; and the lateral extent of the openings of the cavities in the top layer exceed the greatest lateral dimension of the articles by 5 to 15 percent.

* * * * *